United States Patent
Hardin et al.

(10) Patent No.: US 6,185,516 B1
(45) Date of Patent: Feb. 6, 2001

(54) AUTOMATA-THEORETIC VERIFICATION OF SYSTEMS

(75) Inventors: Ronald H. Hardin, Pataskala, OH (US); Robert Paul Kurshan, New York, NY (US)

(73) Assignee: Lucent Technologies Inc., Murray Hill, NJ (US)

(*) Notice: Under 35 U.S.C. 154(b), the term of this patent shall be extended for 0 days.

This patent is subject to a terminal disclaimer.

(21) Appl. No.: 08/946,473

(22) Filed: Oct. 7, 1997

Related U.S. Application Data (63) Continuation-in-part of application No. 08/383,341, filed on Feb. 3, 1995, now Pat. No. 5,691,925, and a continuation-in-part of application No. 08/384,100, filed on Feb. 6, 1995, now Pat. No. 5,740,084, which is a continuation-in-part of application No. 07/906,082, filed on Jun. 29, 1992, now Pat. No. 5,483,470, which is a continuation-in-part of application No. 07/489,438, filed on Mar. 6, 1990, now Pat. No. 5,163,016.

(51) Int. Cl.[7] .................................................. G06F 9/455

(52) U.S. Cl. ................................. 703/2; 703/14; 703/15; 716/4; 716/5; 716/6

(58) Field of Search .................. 395/500.23, 500.35, 395/500.36, 500.05, 500.06, 500.07; 703/2, 14, 15; 716/4, 5, 6

(56) References Cited

U.S. PATENT DOCUMENTS

| | | | |
|---|---|---|---|
| 4,654,780 | * 3/1987 | Logsdon et al. | 710/132 |
| 5,163,016 | * 11/1992 | Har'El et al. | 395/500.06 |
| 5,379,231 | * 1/1995 | Pillage et al. | 395/500.35 |
| 5,483,470 | * 1/1996 | Alur et al. | 395/500.07 |
| 5,491,639 | * 2/1996 | Filkorn | 395/500.06 |
| 5,513,122 | * 4/1996 | Cheng et al. | 395/500.06 |

OTHER PUBLICATIONS

Soriano, T.; Concept of Descednt of a Grafcet Model Application to the Reduction of the Model in a Specific Context; Conference Proceedings of the International Conference on Systems, Man and Cybernetics, 1993—Systems Engineering in the Service of Human, Oct. 1993.*

Aziz, A.; Singhal, V.; Brayton, R.; Swamy, G. M.; Minimizing Interacting Finite State Machines: A Compositional Approach to Language Containment; Proceedings of the IEEE International Conference on Computer Design: VLSI in Computers and Processors, 1994; Oct. 1994.*

Kurshan, R.P.; McMillan, K.L.; Analysis of Digital Circuits Through Symbolic Reduction; IEEE Transactions on Computer-aided Design of Integrated Circuits and Systems; vol. 10, Issue, 11, pp. 1356–1371, Nov. 1991.*

(List continued on next page.)

Primary Examiner—Kevin J. Teska
Assistant Examiner—Douglas W. Sergent
(74) Attorney, Agent, or Firm—James DiGiorgio (57) ABSTRACT

Verification systems which employ automata-theoretic formal verification use a model automaton made from a system process (203) representing the system and a task automaton (205) representing the task and use the model automaton to test (217) whether the language of the system process is contained in the language of the task automaton. An improved technique reduces the computational complexity of the language containment testing by producing a model (216) which represents a system which has been automatically localized with regard to a task. Another technique reduces the computational complexity of stepwise refinement (208). In stepwise refinement, the system automaton is refined a step at a time until it reaches the complexity of a practical implementation. The computational complexity of the stepwise refinement is reduced by a technique which permits language containment to be tested using a set of models made from process-automaton pairs rather than process-process pairs.

14 Claims, 2 Drawing Sheets

OTHER PUBLICATIONS

Baumgartner, J.; Heyman, T.; An Overview and Application of Model Reduction Techniques in Formal Verification; IEEE International Performance, Computering and Communications, Feb. 1998; pp. 165–171.*

Soriano, T.; Concept of Descent of a Grafcet Model Application to the Reduction of the Model in a Specific Context; Proceedings of the International Conference on Systems, Man and Cybernetics, 1993, Oct. 1993.*

Aziz et al., Minimizing Interacting Finite State Machines: A Compositional Approach to Language Containment; Proceedings of the IEEE International Conference on Computer Design, Oct. 1994.*

Huang et al., "An ECFSM–Based Maximal Progress Protocol Verification", Proceedings of the TENCON '93 IEEE Regional Conference on Computer, Communications, Control and Power Engineering, vol. 1, pp. 527–530, Oct. 1993.*

Kurshan, R. P., "The Complexity of Verification", Proceedings 26th Annual ACM Symposium on the Theroy of Computing, pp. 365–371, May 1994.*

Clarke et al., "Formal Methods State of the Art and Future Directions", ACM Computing Surveys, vol. 28, Issue 4, pp. 626–643, Dec. 1996.*

Macii et al., "Formal Verification of Digital Systems by Automatic Reduction of Data Paths", IEEE Trans. on Computer–Aided Design if IC and Systems, vol. 16, Issue 10, pp. 1136–1156, Oct. 1997.*

* cited by examiner

AUTOMATA-THEORETIC VERIFICATION OF SYSTEMS

CROSS-REFERENCE TO RELATED APPLICATIONS

The present application is a continuation-in-part of R. H. Hardin and R. P. Kurshan "Deriving Tractable Subsystem from Model of Larger System," U.S. Ser. No. 08/383,341, filed Feb. 3, 1995, now U.S. Pat. No. 5,691,925 issued Nov. 25, 1997, and R. H. Hardin and R. P. Kurshan "Verification of Homomorphism between Two System Models," U.S. Ser. No. 08/384,100, filed Feb. 6, 1995, now U.S. Pat. No. 5,740,084 issued Apr. 14, 1998, which in turn are both continuations-in-part of Rajeev Alur, et al., "Timing Verification by Successive Approximation", U.S. Ser. No. 07/906,082, filed Jun. 29, 1992 now U.S. Pat. No. 5,483,470, issued Jan. 9, 1996, which in turn is a continuation-in-part of Zvi Har'El et al., "Analytical Development and Verification of Control-intensive Finite State Machines," U.S. Ser. No. 07/489,438, filed Mar. 6, 1990, U.S. Pat. No. 5,163,016, issued Nov. 10, 1992.

BACKGROUND OF THE INVENTION

1. Field of the Invention

The invention relates generally to determining whether a system will perform a given task correctly and more specifically to employing formal verification to make that determination.

2. Description of the Prior Art

A perennial problem in the design of large systems is verifying that the system will indeed behave in the manner intended by its designers. One approach has been simply to try out the system, either by building and testing the system itself or by building and testing a model of it. In recent years, this approach has taken the form of a computer simulation of the system. A computer program which is a model of the system is written, and the system is tested by executing the computer program. A fundamental problem with the approach of "trying out the system" is that the system's designers can only try out behavior which they anticipate. For any but the simplest systems, however, the designers cannot anticipate all of the behavior of the system, and it is of course always unanticipated behavior which causes difficulties.

As the limitations of simulation have become more apparent, interest has grown in the formal verification of system behavior. In formal verification, the designer provides a logical definition of the system's intended behavior and a logical definition of the implementation to a formal verification system. The formal verification system then determines whether the logical definition of the system's intended behavior implies the logical definition of the implementation. If it does, the implementation is faithful to the logical definition of the intended behavior.

A particularly useful kind of formal verification is automata-theoretic verification. In this type of formal verification, the system and the desired behavior are both modelled using a particular kind of finite state machine termed an automaton. A finite state machine consists of a set of states and a set of transitions between the states. A transition from one state to another takes place when a set of variables take on values which are required for the transition to occur. For example, an electrical circuit with a light bulb and a switch can be modelled as a finite state machine with two states light on and light off and a variable switch which has the value 0 when the switch is off and the value 1 when the switch is on. Transitions between the states take place when the value of switch changes. The initial state is light off; the finite state machine remains in the state until switch takes on the value 1. At that point, the finite state machine makes the transition to the light on state and remains in that state until switch takes on the value 0, whereupon the finite state machine makes the transition to the light off state.

One way of looking at the behavior of a finite state machine is to see it as responding to a sequence of values of the variables. For instance, the example finite state machine has only one variable, and that variable can have only two values, 0 and 1, so the example finite state machine will respond to any sequence of 0;0;1;0; and so forth. If there were two variables (for example, if the circuit had two switches), the finite state machine would respond to sequences of pairs of values, for example, 0,0; 0,1; and so forth.

An automaton is a finite state machine in which certain states are to be defined as final states. If an automaton is in one of the final states after it has received a sequence of values, the automaton is said to have accepted the sequence of values. In our example finite state machine, either of the two states is a final state, and the finite state machine is consequently an automaton which will accept any sequence of 0's and 1's.

In mathematical terms, the set of the sequences of values which an automaton accepts defines a language for the automaton. This is important for formal verification because when a system and a task are modelled as automata, the languages of the system and the task can be used to determine whether the system will perform the task. If the language defined by the automaton modelling the system is contained in the language defined by the automaton modelling the task, the system will perform the task. Otherwise, it will not.

The main problem with automata-theoretic verification is that the number of states and transitions in a system of finite state automata which represents a system of any size is so great that the state graphs which the programs that do automata-theoretic verification employ to represent the states of the system may exceed the storage capacity of the computer systems running the programs. Indeed, even if storage could be provided, the number of states is often so large that a computer system still would not be able to do the verification in a reasonable amount of time. This problem is termed the state-space explosion problem or more generally, the computational complexity problem.

The parents of the present patent application all disclose techniques for overcoming the computational complexity problem. One set of these techniques involves stepwise refinement of the system model from a simple model which can be verified to have desired properties to a model which has the complexity required for the actual implementation of the system and which can be verified to have inherited the desirable properties from the simple model. The techniques for stepwise refinement disclosed in the parent patent applications include the use of language homomorphisms to map behaviors of more detailed models into behaviors of less detailed models. As long as there is such a mapping, the behaviors of the more-detailed models preserve the properties of the behaviors of the less-detailed models.

Another set of the techniques involves reduction of the language containment test to a set of language containment tests which are together computationally less expensive than the original language containment test. The user of the verification system does a reduction by first decomposing the property that is being verified into local properties which, when taken together, imply the property being verified. The verification system verifies this implication. Then, the verification system "localizes" the system being verified with regard to each of the local properties. It does this by taking advantage of the fact that only a small part of the system being verified is concerned with the local property. Consequently, the rest of the system may be "abstracted away", and the verification need be done only on the part which is concerned with the local property. If the verification succeeds for all of the local properties, then the property has been verified for the entire system.

A more detailed discussion of the foregoing techniques for dealing with the computational complexity problem and an example may be found at columns 17 through 70 of "Verification of Homomorphism Between Two System Models," U.S. Pat. No. 5,740,084 issued Apr. 14, 1998, which is incorporated herein by reference. A description of a verification system which employs the stepwise refinement and reduction techniques described above may be found in Zvi Har'El et al., "Analytical Development and Verification of Control-intensive Finite State Machines," U.S. Pat. No. 5,163,016, issued Nov. 10, 1992. That patent is hereby incorporated into the present patent application by reference.

The use of stepwise refinement and reduction in the system of U.S. Pat. No. 5,136,016 represented a major step in dealing with the problem complexity. Automata-theoretic verification however remains an expensive undertaking in terms of both computation time and memory resources. It is an object of the present invention to provide improved techniques for stepwise refinement and reduction which further reduce the cost of automata-theoretic verification.

SUMMARY OF THE INVENTION

The object of the present invention is attained by means of two techniques for reducing the size of the model automata used to test language containment and thereby reducing the computational complexity of the test.

The first technique reduces the size of the automaton by employing a directed dependency graph of the model automaton's variables to make a reduced model automaton which is the equivalent of the original automaton for the purposes of testing language containment. In a preferred embodiment, the technique is used to automatically produce a model automaton in which the system component of the model has been localized with regard to the task component so that only those portions of the system model which are relevant to the task specified by the task component are included in the model automaton.

The second technique is used in stepwise refinement. Stepwise refinement involves checking language containment with model automata made from processes between which there is a language homomorphism. Testing language containment with such model automata is computationally substantially more complex than testing language containment with model automata made from a process and an automaton. The technique avoids the necessity of making the model automaton from a pair of processes by transforming one of the processes into a sequence of automata and thereby permitting the language containment testing to be done on model automata made from a process and an automaton.

Other objects and advantages of the apparatus and methods disclosed herein will be apparent to those of ordinary skill in the art upon perusal of the following Drawing and Detailed Description, wherein:

Reference numbers in the Drawing have two parts: the two least significant digits are the number of an item in a figure; the remaining digits are the number of the figure in which the item first appears. Thus, an item with the reference number 201 first appears in FIG. 2.

DETAILED DESCRIPTION OF A PREFERRED EMBODIMENT

The following Detailed Description will first describe the improved techniques for reduction and then the improved techniques for refinement. In both cases, a discussion of the theoretical basis of the techniques will be presented first; thereupon, a discussion of their implementation in a preferred embodiment will be presented.

Theory of Localization Reduction using Reduced Models

As pointed out above, automata-theoretic verification approaches verification as a language containment problem: if the language defined by the automaton modelling the system is contained in the language defined by the automaton modelling the task (property), the system will perform the task (i.e., have the property). The following discussion will first describe generally how it is determined whether one language is contained in another and will then describe the task decomposition and task localization techniques employed to make it computationally tractable to determine whether the language of a system automaton is contained in the language of a task automaton.

Determining Language Containment

The automata employed in the verification systems disclosed in the parents of the present application are ω-automata. Such automata accept sequences of infinite length. Because this is the case, they have acceptance structures which are different from those of automata which accept finite sequences (strings). An acceptance structure for an automaton defines the sequence of states of the automaton which accepts a word in the automaton's language. Because ω-automata accept sequences of infinite length, their acceptance structures are acceptance cycles of states instead of final states. An acceptance cycle of states for a given sequence of states is the cycle of states in which the given sequence remains. To check language containment with ω-automata, one determines whether all of the cycles of the finite state automaton representing the system are contained in the acceptance cycles of the finite state automaton representing the task. If they are, the system performs the task.

An efficient way of making that determination is to first make a complement task automaton whose language is the set complement of the language of the task automaton. Having done this, one makes an automaton which is the product of the system automaton and the complement task automaton and determines whether the language of that product automaton is the empty set. If that is the case, none of the cycles of the system automaton are contained in the complement task automaton, and consequently, all of the cycles of the system automaton must be contained in the acceptance cycles of the task automaton. In the following, the product automaton upon which the containment test is performed is termed the model automaton or simply the model.

One way of determining whether the language of the model is the empty set is based upon explicit state-space enumeration. This technique works as follows: all of the cycles in an automaton are captured by the set of strongly connected components of the directed graph representing the automaton. (In the graph, states are vertices and transitions are edges. The graph is directed because a given transition only goes in one direction.) A strongly connected component of a directed graph is a nonempty set of vertices maximal with respect to the property that any ordered pair of vertices from the set are connected by a directed path from the first to the second. Thus, to determine whether the language of the model is the empty set, one constructs the set of strongly connected components and determines whether it contains any cycles which are accepted by the automaton acceptance structure; if it does, there are cycles of the system automaton which are not contained in the acceptance cycles of the task automaton and the system does not perform the task. The cycles which are accepted by the automaton acceptance structure are termed the model automaton's error track, and as described below, the error track can be used to correct either the system or the model automaton.

Task Decomposition and Task Localization

The difficulty with the foregoing technique is that the directed graph representing the model may be still too large to be searched by a computer. This problem is dealt with in the verification system being described herein by task decomposition and task localization.

In task decomposition, the task to be verified is decomposed into local tasks such that the intersection of the languages of the local tasks is contained in the language of the entire task. When that is true, the system will perform the task if, for each of the local tasks, the language of the system is contained in the language of the local task. In the preferred embodiment, task decomposition is done by the person verifying the system. That person uses his knowledge of the system and the task to make the decomposition, and the verification system then verifies that the intersection of the languages of the local tasks is contained in the language of the entire task.

Task decomposition is used together with task localization. The models made using both task decomposition and task localization are made from a local task automaton and a localized system automaton. Each localized system automaton has been localized with respect to its local task automaton, that is, those portions of the system automaton which are not relevant to the local task automaton are abstracted away. This makes the computation of the language containment significantly less complex than when it is done with a model made from the system automaton and the task automaton. But the language containment test remains valid if each of the localized models pass the test, the language of each of the localized system automata is contained in the language of its corresponding local task automaton and the language of the entire system is contained in the language of the entire task. For a complete mathematical exposition of the foregoing, see columns 317 through 331 of "Verification of Homomorphism Between Two System Models," U.S. Pat. No. 5,740,084.

Finding Localized Models

As will be apparent from the foregoing, a major problem in automata-theoretic verification is finding a set of localized models for which computation is substantially less complex than for the model made from the entire system automaton and the entire task automaton but which nevertheless yield valid verification results. The present application presents a novel solution to that problem which automatically finds a relatively small localized model for each of the local task automata.

At the highest level, the technique works as follows: first, a localized model is made from the local task automaton and a reduced system automaton which has relatively few constraints. Beginning with that model, the following iteration is performed: the language containment test is done using the current localized model; if it passes, the iteration ceases: otherwise, an error is returned from the language containment test; that error is tested to determine whether it represents a real error in the system or is simply an artifact resulting from insufficient constraints in the localized model. In the former case, a real error has been found and the iteration terminates; in the latter case, the results of the test of the error are then used to make a new localized model with more constraints. The next iteration uses the new localized model as the current localized model and the iterations continue until a localized model is found that passes the containment test or a real error is found in the system automaton. The same iteration is repeated for each of the local tasks, and when a localized model which passes the containment test has been found for each of the local tasks, the containment of the language of the entire system automaton in the entire task automaton has been verified.

In a preferred embodiment, the localized models are found by first making a directed dependency graph for the model made from the local task automaton and the entire system automaton. The graph shows the dependencies between the local task and the entire system task. In a preferred embodiment, the states of the model and the transitions between the states are represented by variables, and the dependency graph shows dependency relations between these variables. Once the graph is made, it is used to make the model, with the beginning constraints being determined by the user of the verification system. If the user does not specify any constraints, the first model is made from the local automaton from the local task and the empty set (representing a localized system automaton which imposes no constraints on the model) or from a default first model supplied by the user. Continuing with the case of the empty set, the empty set is contained in any set, and consequently, the containment test on the localized model fails unless the task is trivially true.

In the preferred embodiment, when a containment test fails, the error track produced by the verification system contains a counter example, that is, a sequence of transitions in the language of the system automaton being tested which is not contained in the language of the task automaton being tested. Next, the verification system determines whether the counter example from the error track is contained in the language of the entire system automaton. If it is, the counterexample is a real error and the verification system has shown that the entire system does not perform the entire task. Otherwise, this containment check produces a second error track.

If the error track is not contained in the language of the entire system, then the error track was caused by the fact that the current localized model was not sufficiently constrained to pass the containment test and information from the second error track is used to determine the portion of the dependency graph from which the new localized model is to be made. The new localized model is then tested for language containment as described above, and the iterations continue until either the system automaton is demonstrated to contain an error or a localized model has been found for which the containment test succeeds. As may be seen from the foregoing, the limit for the localized model is one made using the entire system automaton.

For each local task automaton, a localized model is found in the manner just described, and if the containment test succeeds for all of the models, the verification system has verified that the entire system performs the entire task. A detailed mathematical exposition of the foregoing may be found in Section 8.4 of Appendix A at columns 351 through 356 of "Verification of Homomorphism Between Two System Models," U.S. Pat. No. 5,740,084. More specifically, the foregoing describes the follow(p,P) algorithm set forth in section 8.4.2 therein.

Figure 2:
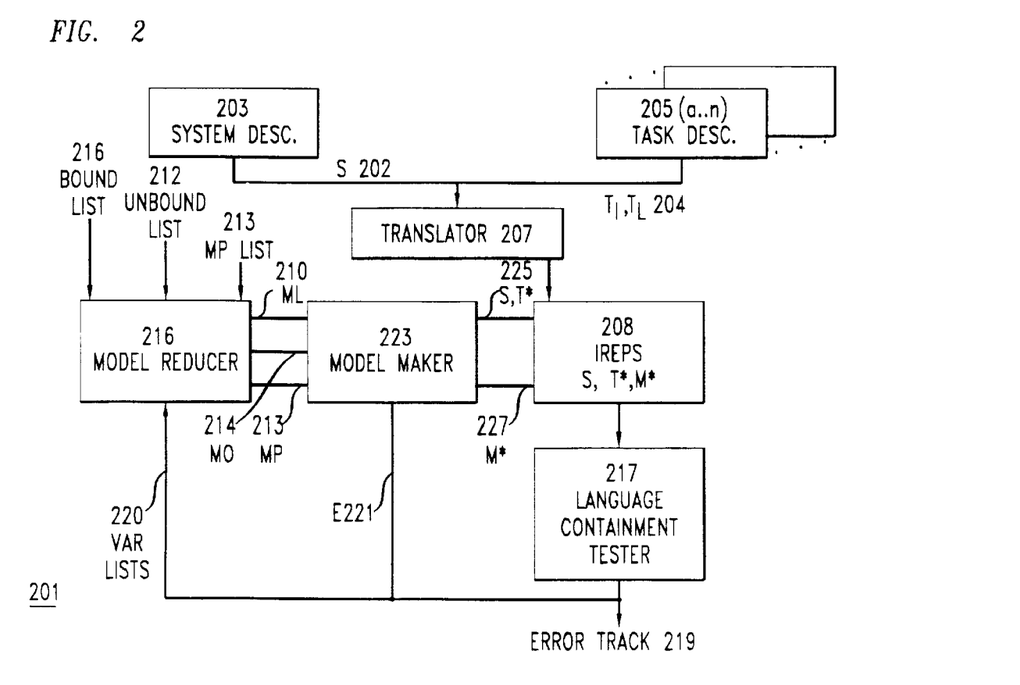
FIG. 2 is a block diagram of a formal verification system.
Figure 3:
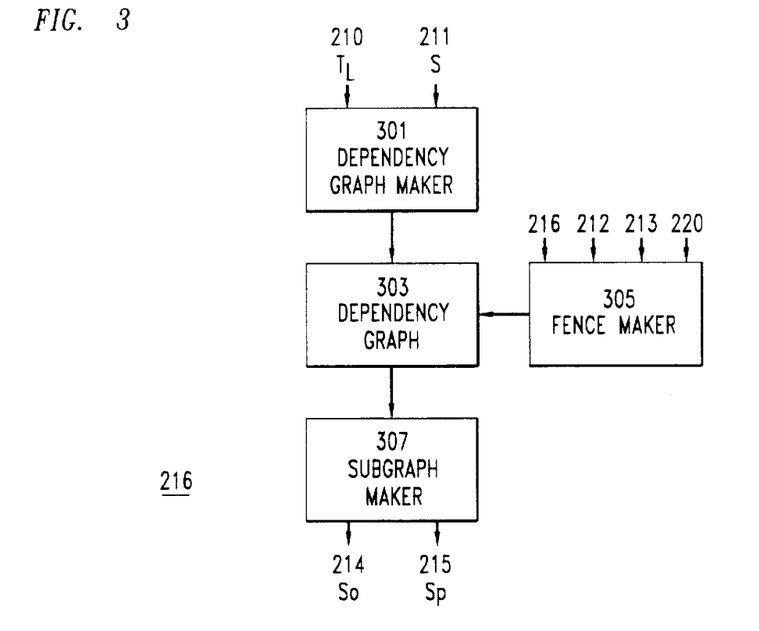
FIG. 3 is a detailed diagram of a model reducer employed in the system of FIG. 2.
Figure 4:
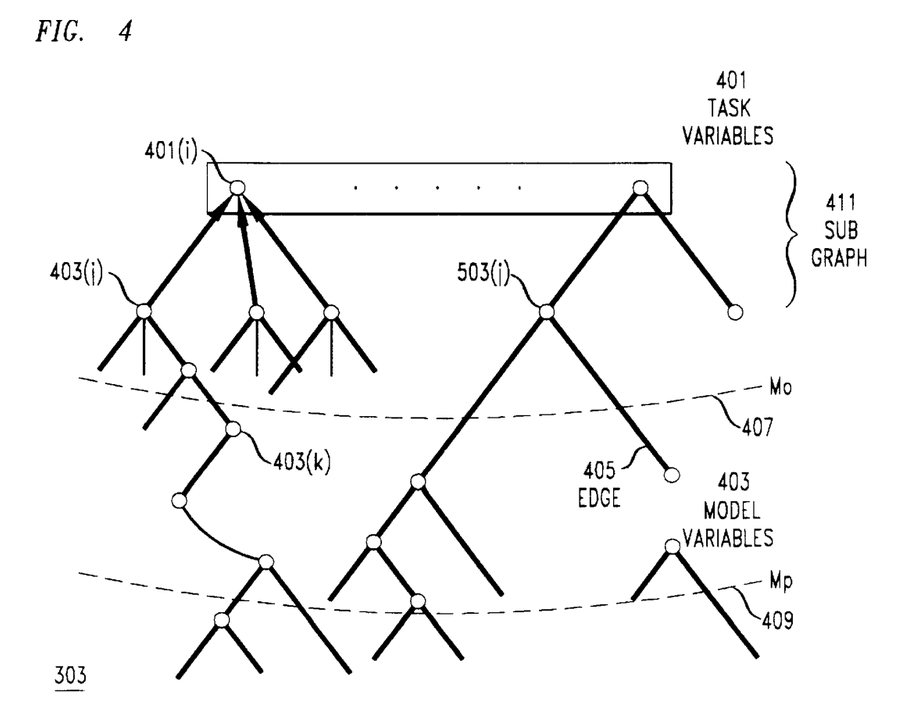
FIG. 4 is a diagram of a directed graph of variable dependency.

Implementation of Reduction: FIG. 2–4

The following discussion will provide an overview of a formal verification system which employs the localization techniques described above and will then provide details of an implementation of the techniques in that system.

A Formal Verification System: FIG. 2

In a preferred embodiment, the technique described above is implemented as a new component of a verification system of the type described in U.S. Pat. No. 5,163,016. FIG. 2 is a block diagram of such a verification system. Verification system 210 takes as its input a description 203 of the entire system to be verified and descriptions 205(0...n) of the entire task and local tasks for which it is to be verified. The user of the system makes the local tasks from the entire task by the task decomposition and verification techniques previously described.

In a preferred embodiment, descriptions 203 and 205 are written in a programming language which is explained in an appendix of U.S. Pat. No. 5,163,016. In the descriptions, the states of the automaton are defined by means of sets of values of state variables or stvars and the transitions are defined by means of sets of values of selection variables or selvars. When an automaton is in a state defined by a set of values of the state variables, a transition to another state occurs when the set of selection variables defined for the transition satisfies a set of tests defined for the transition. That set of values for the variables is termed the predicate of the transition. In most cases, the descriptions specify ranges of values for the state variables and selection variables.

For example, in the case of the light bulb automaton, the light on state of the light bulb automaton would be defined by a single state variable, called perhaps $light_{13}$ state and a value 1 representing the light on state. The light off state would then be represented by the value 0 of that variable. The selection variable for the automaton is the variable switch, and the predicate for the transition from the light off state to the light on state is that the selection variable switch is equal to 1; similarly, the predicate for the transition from the light on state to the light off state is switch=0. Both the light_state state variable and the switch selection variable would be specified to have values in the range (0,1).

Another important aspect of these descriptions is that they define the acceptance structures of the automata in terms of recur edges and cycle sets or cysets. A recur edge is a transition which is crossed infinitely often by a sequence which is accepted by the automaton. A cycle set is a set of states which makes up an acceptance cycle for the automaton. The light bulb automaton will accept any infinite sequence of 0's and/or 1's, and consequently, all of the transitions in the automaton are recur edges and there is a cycle set including both states.

The descriptions of the system and task automata are input to a translator 207, which produces internal representations (IREPS) 208 of automata for the task and system. System automata in the following are represented by S and task automata by T. In a preferred embodiment, the internal representations are parse trees made from descriptions 203 and 205.

As described above, verification in system 201 is essentially a matter of determining whether the language of one ω-automaton is contained in another ω-automaton, and this in turn is done by examining the state of a model automaton made from the two automata whose language containment is to be verified. In system 201, the models are made by model maker 223, which receives parse trees of automata as inputs and provides parse trees of models made from the automata as outputs.

The containment testing on the models is done by language containment tester 217, which takes a model as an input and performs the language containment test on the model. If the containment test fails, language containment tester 217 produces an error track 219 which itself describes an automaton E. As shown by arrow 221, E can then be provided to model maker 223 together with another automaton to make a new model, which can then be tested by language containment tester 217 to determine whether the error is a real error or is an artifact of the choices made in decomposing a task.

Language containment tester 217 employs known techniques for testing language containment. In brief, language containment tester 217 receives the parse tree of the model being tested for language containment and makes a working representation of the model which permits the states which result from the operation of the model to be explored. The working representation implements a function which takes a global state of the model and a predicate for a transition and then produces the new global state that results from the application of the predicate to the old global state. The global state is represented by a set of values of the state variables and the predicate is represented by a set of values of the selection variables. The operation of this function is termed cranking in some of the following discussion.

Each predicate is marked to indicate whether it is a recur edge and each global state is marked to indicate whether it belongs to a cycle set. These marks are used to construct a result graph of sets of global states which contains none of the cycle sets of the model for which containment is being tested. If the result graph nevertheless contains a cycle, the language containment test has failed and the cycle is reported in the error track. One technique for making a result graph is to use a reached state table of the states; an example of such a technique is that described in U.S. Pat. No. 5,163,016. Another technique for making a result graph employs binary decision diagrams (BDD's), as described in K. L. McMillan Symbolic Model Checking, Kluwer, 1993.

Implementation of System Localization

The automatic system localization techniques described above are implemented in model reducer 216 of FIG. 201. Model reducer 216 takes a local task automaton $T_L$ 210 and a system automaton S as its inputs and produces two models therefrom: an optimistic model $M_o$ 214 and a pessimistic model $M_p$. The optimistic system automaton $M_o$ is a model made with an optimistic localization of system automaton S with regard to $T_L$, while $M_p$ is made with a pessimistic localization of that system automaton with regard to that local task. In the preferred embodiment, the user defines $M_p$ via input 213. The user may simply define $M_p$ as the model made with $M_L$ and S or may define a somewhat smaller model as $M_p$ if he wishes to limit the amount of time spent checking language containment. In the preferred embodiment, the user may also define a first $M_o$ via inputs 212 and 216; if the user does not, the system begins with a $M_o$ that is guaranteed to fail the containment test.

Once $M_o$ and $M_p$ are defined, the iteration previously described begins.

Language containment tester 217 tests the current $M_o$ for language containment and if any error track 219 results, provides the error track 219 to model maker 223 (arrow 221), which makes a model from the error track E and $M_p$. That model is then provided to tester 217 for containment testing. If the model passes, the error is real. If the model does not pass, error track 219 from the test against $M_p$ is used to derive information 220 which is used in model reducer 216 to produce a new larger $M_o$. The iterations continue until a real error is found, until an $M_o$ is found which passes the containment test or until $M_o = M_p$.

Details of Model Reducer 216: FIG. 3

Continuing with details of model reducer 216, in a preferred embodiment, model reducer 216 has four components: dependency graph maker 301, dependency graph 303, fence maker 305, and subgraph maker 307. Dependency graph maker 301 makes dependency graph 303 from the internal representation 208 of the model made from internal representations 208 of entire system automaton S 211 and local task automaton $T_L$ 210. As will be described in more detail below, fence maker 305 makes "fences" in dependency graph 303 which define subgraphs of dependency graph 303. Subgraph maker 307 makes and prunes the subgraphs defined by the fences and the pruned subgraphs in turn define a current $M_o$ automaton and the $M_p$ automaton.

Details of Dependency Graph 303

FIG. 4 shows dependency graph 303. Dependency graph 303 is a directed graph of dependency relationships between the variables (both stvars and selvars) of the model made from entire system automation S and local task automation $T_L$. A first variable is dependent on a second variable if a value contained in the second variable is assigned to the first variable or if a value contained in the second variable determines whether a value is assigned to the first variable. Thus, in the light bulb automaton, the state variable light_state is dependent on the selection variable switch. There is a vertex 401(i) for each variable in the model, for each variable in system automaton S. Whenever a first variable is dependent on a second variable, there is an edge 405 from the second variable to the first variable. When graph 303 is constructed from the parse tree for the model, construction begins with the variables 401 of the model which come from task automaton $T_L$. These variables are termed the "root variables" of graph 303. The graph then includes all variables of the model S upon which the root variables 401 depend. The more edges there are between a given variable 403(j) of system automaton S and a root variable 401(i), the more remote the dependence of variable 401(i) on variable 403(j).

Because graph 303 is arranged as described above, it can be used to define a localized model $M_o$ for a system automaton S which has been localized with respect to local task automation $T_L$ whose variables form the root of graph 303. First, if the variables of $T_L$ are all independent of a given variable of S, the given variable of S will simply not be one of the variables of model variables 403. Second, the more remote a given variable 403(j) is from a root variable 401(i) in graph 303, the more likely it is that the given variable 403(j) is not relevant to determining whether the language of system automaton S is contained in the language of local task automaton $T_L$.

The preferred embodiment employs the foregoing properties of graph 303 to define $M_o$'s which are decreasingly localized with regard to $T_L$ until an $M_o$ is found which passes the containment test or a real error is found. Conceptually, an $M_o$ which is localized with regard to $T_L$ can be defined from graph 303 simply by drawing a line or "fence" (for example, line 407) across the graph such that all of the variables of $T_L$ are on one side of the line. The fence 407 defines a subgraph 411 consisting of the model variables 403 on the root side of fence 407 and that subgraph is used to define $M_o$ defined by fence 407. If the check fails, fence 407 is moved away from root 401 to define a new subgraph, the new subgraph is used to define a new $M_o$, the language containment check is made on the $M_o$, and so forth.

In a preferred embodiment, fence 407 is defined by a list of state variables. The state variables on the list and those variables 403 in graph 303 which are further from root 401 than the state variables on the list are not part of the $M_o$ defined by fence 407; all other variables 403 in graph 303 are. Fence 407 is defined and redefined in model reducer 216 by fence maker 305. In the preferred embodiment, the user of verification system 201 may provide fence maker 305 with a bound list of variables 216 and an unbound list of variables 212 to define an initial fence 407 for $M_o$ as well as a list of variables which defines a fence for a pessimistic model $M_p$. The fence for pessimistic model $M_p$ appears in FIG. 5 as fence 409. As will be explained in more detail in the following, fence maker 305 moves fence 407 in the preferred embodiment in response to an error track produced from the model made from the error track produced by the preceding model $M_o$ is tested for containment. The former error track is used to produce variable lists 220, which are used to define the new position of fence 409.

Details of Subgraph Maker 307

Subgraph maker 307 makes the subgraphs representing $M_o$ and $M_p$. There are three steps to making the subgraphs:
determining the subgraph defined by the relevant fence;
"freeing" variables in the free list which defines the fence; and
resizing variables in the subgraph.

The first step forms a new variable dependency subgraph by first removing every edge which enters a vertex in the free list whose variable is not of type integer. Integer variables are those which do not have defined ranges in system description 203 or task descriptions 205. The subgraph then consists only of those vertices for which there is still a directed path from the vertex to one of the task variables 401. The second step frees all variables in the free list for which a range of values has been defined in the original descriptions of the automata.

Freeing a variable in the present context means permitting the variable to take on any value in a range which was defined for it in the original descriptions of the automata.

Because the variable has been freed, the states of the automaton defined by the subgraph will include any state reachable by any transition which includes one of the possible values of the variable. Freed variables consequently will not constrain the behavior of the automaton defined by the subgraph. As is apparent from the foregoing, integer variables cannot be freed because there is no limit to the range of values they can take.

The resizing step redefines the ranges of selection variables in the subgraph so that the range of a given selection variable includes all of the values which it may have anywhere in the subgraph. It is done like this:

1. for each variable x, check if
   a. every appearance of x is of the form:
      x=constant
      or
      x=constant
      or
      (x: constant_list)
      and
   b. if x is the unique selvar of a proc A. then every appearance of 'A:'
      is of the form: (A: constant_list) and
   c. the union of the constants and constant_lists of a) and b) omits at least 2 elements in the range of x: [so, this excludes ->x,x<5 and x+1=5, for example]
2. Then, if a-c hold, and % is the 1st value in the range of x omitted redefine the range of x to be the union of c) and the value %: call that value new_range. If x is freed, then it can be assigned values is relative to new_range. Otherwise, x is not freed: in this case, suppose F is the (logical) expression to which x is assigned (ie, the assignment of x is equivalent to x:=F or x->F); then redefine the assignment of x as:
   x:=F? (F: new_range) |%
   (or x->F ?, accordingly).

This re-definition of the assignment of x is important on account of the reducing step.

The variables of the subgraph, resized as set forth above, then make up the automaton $M_o$ or $M_p$ defined by the subgraph.

Details of Moving the Fence

As indicated above, if $M_o$ defined by a fence 407 is not constrained enough to pass the language inclusion test, the fence must be moved. Fence maker 305 does this in response to three variable lists 220, Vars_f, Vars_c, and Vars_r, returned from containment tester 217 as described above. The following discussion will first give details about how containment tester 217 computes these sets of variables and then give details about how the variables are used to calculate the new fence.

The variable lists 220 are produced by a routine in containment tester 215 that tests whether the language $L_E$ defined by the error track from the containment check for $L(M_o)$ is contained in $L(M_p)$. In the test, the error track defines an automaton E. E is treated as a process with state transitions enabled by 'true' from its i-th (vector) state to its (i+1)-st (vector) state, for all I up to the length of E in the case of a finite E, i including the additional back-edge, in the case of a "Bad cycle" E. The routine performs the containment test by checking that each "next-state" of the automaton S⊗T which is the product of the automata $M_p$ and $T_L$ matches the corresponding next-state of E (i.e., consider the state variables of E that also belong to S⊗T their respective values in E are checked for a match with those in S⊗T for each next-state of S⊗T and the (unique) next-state of E.) If there is no match, truncate that transition.

A state of S⊗T⊗E with every exiting transition thus truncated is called a lock-up. For each lock-up state V, for each selection valid at V, let v be the 1st state component of E which fails to have its next-state value match the next-state value of v in E, say v=v_i+1. If v=v_i is the current-state value of v (i.e., value of v in V), look at the variables which enable the transition v_i->v_i+1. Call these Vars(V). We compute Vars(V) during the crank, setting Vars(V)=0 at the end of crank, if it turns our that V is not a lock-up. [Note that Vars(V) will consist only of variables of $M_o$ (free or otherwise).]

Vars(V) is computed like this: For each selection (in S⊗T at V, as we crank out the stvar's of S⊗T case RESOLVE), for each stvar v which is a component of E, check if the next-state matches the required next-state value in E. If yes, continue; if not, stop case RESOLVE for that selection, and add to Vars(V) some variables which collectively disable the transition from the current value of v to the required next value of v. If this particular set of variables is too hard to compute, get as close as practical (too many variables is ok; too few is not allowed); for example, all variables upon which v is dependent gives a list, when a finer list is impractical. Add these variables to Vars(V), and pick the next selvar (valid at V) to crank. Continue like this until all selvars are cranked. If for any selection, the required next-state match occurs, set Vars(V)=0, and set a flag to ensure that it stays=0 for the rest of the selvar cranks (but, continue to crank all selections from V, as there may be other states with next-state matches: we want them all).

There are 3 possible conclusions to the run of S⊗T⊗E:

Case 1: If E is a "finite" error track ("No transition", "Lockup", etc), we reach the last state of E in S⊗T⊗E, and reproduce the same error, or another error which results in the same finite error track, or an infinite error track consisting of a "Bad cycle" self-loop at the final state of E; or, E is an "infinite" error track ("Bad cycle") and we reach the end of E, and then can continue to cycle in the Post modern cycle of E, eventually reaching the same state of S⊗T⊗E twice AND the verification system reports the result in S⊗T⊗E as a "Bad cycle" (ie, not accepted by a cyset/recur in S⊗T). In either case, the result is a real error. Thus, as soon as this case applies (if at all), we stop.

Case 2: The conditions defining Case 1 fail, meaning that E is an artifact of the optimistic model $M_o$. This situation can arise for several reasons, which we separate into Case 2 and Case 3. One reason Case 1 may fail is that we fail to reach the end of the E track (for all possible init matches of E in S, and all possible selections along the path of E). In this case, let vars=UVars(V) (union over all lock-ups V) and let Vars_f be the elements of Vars which are in the active $M_o$ (free-) list. [Note: there is a possibility that Vars_f is empty.] Set Vars_c=Vars_r=0.

Case 3: Suppose Cases 1 and 2 don't apply. In case E itself is infinite (ie, a Bad cycle track) and we reach the last state of E, with one or more additional transitions through the 'Post mortem' loop of E, arriving finally twice to the same state of S⊗T⊗E, but the verification system reports the result in S⊗T⊗E as "Task performed", then look at the cyset check at the end of the run: each SCC (strongly connected component) must have been contained in some cyset of S⊗T. (This applies for each match of init's in S, and each branch in S⊗T⊗E which follows E, so there may be several.) Each such cyset must have involved stvar's which are NOT components of E. Let Vars_c be the set of all these. Furthermore, let Vars_r be the set of stvar's crossing recurs after the 'Post Mortem' point of E. (These will be stvar's of S not in E. These stvar's arising from recurs are treated the same as the stvar's in Vars_c, defining the set Vars_r. If we don't ever arrive to the same state twice, for any init's match (although we've reached or passed the end of E), then we are in the same logical condition as Case 2, and we proceed analogously. In all these possibilities, we define Vars and Vars_f as in Case 2. Thus, in Case 3, we have Vars_f, Vars_c and Vars_r defined. (Note that Case 3 includes the possibility that some embeddings of E in S$\otimes$T $\otimes$E fall under Case 2; there may be several embeddings of E, defining respective Vars_c and Vars_r; the definitions of all the Vars_* accumulate over these respective embeddings.)

Computing the new $M_o$

We need to define a new (more pessimistic) optimistic model $M_0$. The technique for doing so involves the use of disconnects: Let x be any variable. A variable d is a disconnect of x if every path in the dependency graph from d to x goes through a stvar not equal to d. A disconnect d of x is "minimal" if some path from d to x does not pass through another disconnect of x.

Compute a new $M_o$ free list L' as follows from the previous $M_o$ list L and Vars_f, Vars_c, Vars_r:

Case 1: Vars_f non-empty. For L' from L by removing from L each element of Vars_f, and add to L' each disconnect d of an element of Vars_f, unless d is in the root list of $M_p$. [Since the pruning step will remove all non-minimal disconnects, they need not be added to L'.]

Case 2: Vars_f=0, Vars_c and/or Vars_r non-empty.

Let Vars_cc be the set of elements of Vars_c and Vars_r which are closest (in the dependency graph) to element of L. Set Vars_f to be the set of elements v of L for which there is a path in the dependency graph from an element of tt Vars_cc to v. Then apply case 1.

Case 3: Case 4: Vars_f=0, Vars_c=0, Vars_r=0. If Case 3: Vars is non-empty and there is a unique variable in L closest to Vars (in the dependency graph), or Case 4: there is more than one variable in L closest to Vars (if Vars=0, we consider all the variables of L to be closest to Vars). Set Var_f to be these, and apply Case 1.

In each case, this gives the new $M_o$ list. (Note: as a fail-safe mechanism, we return an (internal) error and stop, if N>number of variables in the $M_p$ model, a logical impossibility.)

Using Minimal Flow to Determine Fence Location

One of the factors which determines the computational complexity of language containment done using the model is the number of values in the ranges of the variables of the model. One consideration in moving fence 407 is picking a new location for fence 407 which minimizes the number of these values. In a preferred embodiment, this is done by means of a minimal flow computation.

In a preferred embodiment, the fence is defined by a list of state variables. The variables which define the fence are free and the variables between the fence and the root are active, that is their values are determined by the values assigned to the free variables. When the fence is moved, the old free variables become active and the state variables defining the new fence location become active. In the preferred embodiment, the new location of the fence is determined as follows:

Starting with:
  the active variables, the old free fence on its boundary, and a set vars_f of old free fence variables to be made active, Find:
  the new set of active variables, by finding its new free fence on its boundary. The new free fence will always have a minimal product of free selections given what stvars are active, and if the user provides a limit for the product with the -#freesels=parameter, successive stvars will be activated until the limit is met.

So: given the old active vars and the free-fence vars to be made active: make the new vars active.

Now find successive stvar fences starting from the new active vars, and going outward through free variables. Label the stvar fences 1.2 . . . N. Set VCUT =N+1.

These are the forward stvar fences, selected by the set of variables to be made active.

Now label any other stvar fences encountered starting from all active variables (the backward fences) N+2. . . NN.

These labels are used to determine which stvars to favor including in the active set later.

If the -#disconnect parameter is specified, advance the newly activated variables to the first stvar fence. (The directionality has been saved in the fence labels.)

The problem is converted into a minimal flow problem by
1. saying we want to minimize the sum of logs of selections on the new free fence, instead of the product of free selections;
2. dividing each variable into an input invariable and an output ovariable with a single channel between them having capacity equal to the log of the number of free selections for the variable;
3. joining each ovariable to foreign ivariables it depends on with an infinite capacity channel.

The active variables are an infinite source of flow to the variables they depend on (so the old free fence is fed by an infinite source), and each stvar ovariable has an infinite-capacity channel to an infinite sink.

Thus the flow will be limited by the capacity of certain ivariable-to-ovariable channels internal to original variables. These limiting variables form the new free fence.

The computation of flow given this graph (source, channels, sink) is done with the usual maximal flow algorithm (see Wagner, "Principles of Operations Research", Appendix I, "Advanced Topics in Network Algorithms", Prentice Hall, 1975, p.953–958). It proceeds as follows:

zero all flows, and all nodes marked Sink-side except the source marked Source-side.

Look at a source-side node; if any channel to a sink-side node has a flow that's less than capacity, mark the channel Plus, and mark the far node Source-side: if any channel from a sink-side node has a flow that's nonzero, mark the channel Minus, and mark the far node Source-side.

If the sink is finally marked Source-side, then there's a path from source to sink marked with Plus and Minus's, along which flow can be improved.

Find this path (we use bfs), and how much it can be improved. This is the minimal remaining capacity on Plus channels and the minimal existing flow in Minus channels along the path.

Increase (Plus) and decrease (Minus) the flow along this path, and start over with the new flow.

When there's no path to the sink, the flow is maximal. When finding the path, paths from stvars to sink are favored, so the flow stays as close to the source as possible. (There may be other distant flows giving the same capacity.)

Given the maximal flow, the new free fence is given by the variables whose ivariable-to-ovariable channel limits the flow.

Complication: how to find which variables limit the flow:
1. For each variable with capacity i-o flow, increase the capacity of the channel and look for a flow-improving source-to-sink path. If the path is found, the variable limits the flow, and hence is on the new free fence. Restore its original capacity if so.
2. If not, leave the capacity increased for the variable.
3. After all the limiting variables have been found, restore all the capacities to the original values.

The order in which variables are checked determines whether near or far variables wind up on the free fence, given a tie. (For example, a linear chain of equal-capacity variables; any one of them limits the flow after all the capacities on the others are increased. The parameter -#maxvars says pick the most distant variable (i.e., increase the capacities on the near ones first in this test).

If an undesired variable winds up on the free fence, give its i-o channel infinite capacity and recompute the flow.

Undesired variables are: stvars, or any selvar that's tied to an active stvar within a selection predicate.

Limiting the flow, -#freesels=

If the resulting flow exceeds the limit specified in -#freesels, the network is changed by shutting down the stvar-to-sink channels on selected stvars. (This will eventually drop the maximal flow and thus move the discovered new free fence outward.) One stvar is shut down per iteration, as follows.

First, if there's a stvar in the maximal flow, shut it down.
If not, pick the largest-flow stvar with label less than VCUT. This will be in the forward direction, defined by the original variables-to-be-activated.
If there are none, pick the lowest-label (i.e., nearest) stvar in the backward set, with label greater than VCUT.
Having shut a stvar-to-sink channel down, increase VCUT, so the directionality is gradually lost from the problem as the solution grows.

The -#slowdisconnect=M Parameter

The flow computation is iterated M times whether the number of free selections resulting is big or small; this advances the fence past M stvars on the average, is the idea, rather than just advancing past the first stvar fence all at once. If the width of the first stvar fence is less than M, M is reset to the actual fence width. The option can be used as well as -#disconnect, which then performs both actions.

Stepwise Refinement and Homomorphism Verification

As pointed out in the Description of the Prior Art, another important technique for dealing with the computational complexity problem is stepwise refinement. In stepwise refinement, a simple system is refined in a series of steps. Each of the steps produces a refined system which is more complex than the system or task it was refined from (the abstract) system or task, and eventually, the refined system has the complexity required for an actual implementation. At each step, it is possible to verify that the refined system produced by the step is a correct refinement of the abstract system it was refined from. If the refinement is correct, the refined system inherits desired properties from the abstract system.

Refinement is typically used as follows: as indicated above, the design of a system begins with a simple model of the system and a simple model of the task it is to perform and the performance of the task by the system is verified for these models. Then the system model is refined, and the verification system verifies that the refinement has inherited the properties required to perform the task. Refinement continues until a refined system model is obtained from which the actual implementation may be made.

In the verification system of U.S. Pat. No. 5,163,016, language containment is used to verify the correctness of a refined system vis-a-vis its abstract system. The use of language containment is, however, complicated by the fact that the automaton representing a refined system has more variables than that of the abstract system, and consequently, the language of the automaton representing the refined system is often not related to the language of an automaton representing the abstract system it was refined from. However, even when the former language is not related to the later language, the refinement can be verified if there is a homomorphism from the boolean algebra defined by the abstract system automaton's variables to the boolean algebra defined by the refined system automaton's variables. In the following, the mathematics of homomorphism will be explained in more detail, and thereupon it will be shown how homomorphism may be used to verify refinements. A precise mathematical discussion of what follows may be found in Sections 8.5–8.11 of Chapter 8 of Appendix A at columns 355 through 408 of "Verification of Homomorphism Between two System Models," U.S. Pat. No. 5,740,084.

Figure 1:
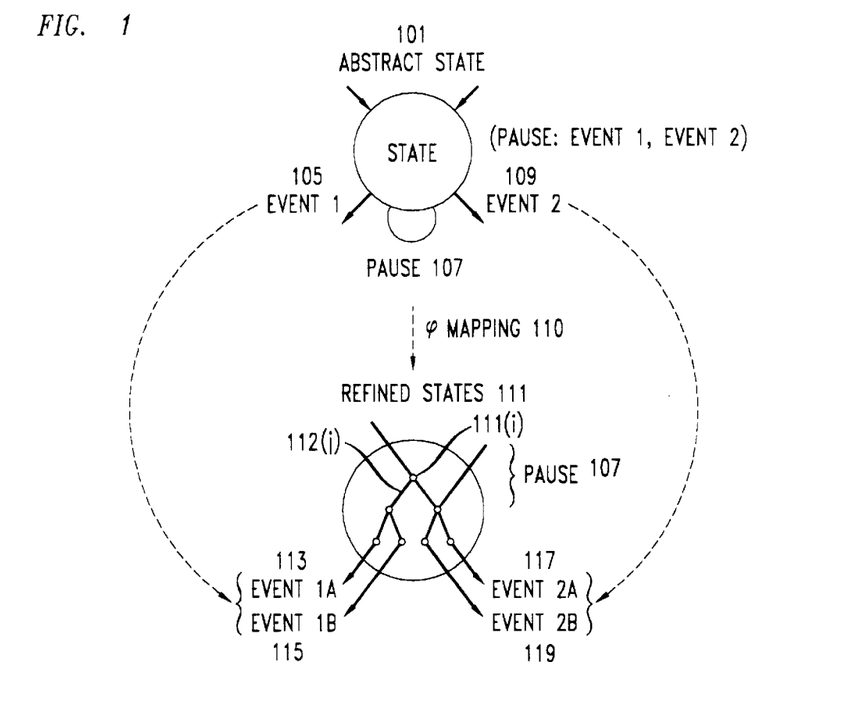
FIG. 1 is a diagram showing a homomorphism.

Homomorphisms: FIG. 1

As previously stated, each transition from one state of an automaton to another has a predicate which specifies tests which the selection variables must satisfy if the transition to which the predicate belongs is to occur. The predicate can be encoded as a bit string, with each of the bits in the bit string representing the result of a test specified in the predicate. In the following, what the bit string encodes is termed an event. More precisely, an event is a global assignment of the output variables of the automaton. The output variables are in turn the variables which appear in the predicates of the automaton's transitions.

The bit string encodings of all of the events in the automaton further define a Boolean algebra for the automaton. A first Boolean algebra is the image of a Boolean algebra homomorphism of a second Boolean algebra if there is a mapping $\phi$ between the events of the first automaton and disjunctions of events of the second automaton such that for the operations of Boolean addition, multiplication, and negation, when an operation is performed on events of the first automaton to produce a result event, the mapping of the result event to the events of the second automaton yields a mapped result event in that automaton, and when the same events of the first automaton are each mapped to events in the second automaton and the operation is performed there, the result event in the second automaton is the same as the mapped result event. When the foregoing is applied to refinement, the Boolean algebra homomorphism is from the Boolean algebra of the abstract automaton to the Boolean algebra of the refined automaton.

It will be apparent from the foregoing that the Boolean algebra of an automaton is closely related to its language, and as might be expected from this fact, where there is Boolean algebra homomorphism $\phi$ from the events of a first automaton to the events of a second automaton, there is also a language homomorphism $\Phi$ from the language of the second automaton to the language of the first automaton, or in the refinement context, from the language of the refined automaton to the language of the abstract automaton. Moreover, for each language homomorphism, there is a unique Boolean algebra homomorphism, and vice-versa.

What all of this means can be seen in more concrete terms in FIG. 1. Abstract state 101 is a state in an abstract automaton which is to be refined; state 101 has three outgoing transitions; the event for transition 105 is event 1;

the event for transition 109 is event 2; the third transition, pause 107, is a place holder for several sequential events in a refinement. Refined states 111(0 . . . 7) are the states in the refined automaton that correspond to state 101 of the abstract automaton. Transitions 112 (0 . . . 6) are the transitions between those states 111. There are four transitions 113, 115, 117, and 119 which correspond to transitions 105 and 109 respectively in state 101. As can be see from the figure, there is a homomorphic mapping φ 109 from the events of state 101 to the events of state 101 to the events of states 111, pause 107 maps onto the events of the transitions 112(0 . . . 6); event 1 105 maps onto event 1a and event 1b; and event 2 maps onto events 2a and event 2b. Presuming that there is such a mapping from each event of the automaton to which state 101 belongs to the events of the automaton to which states 111 belong, there in a Boolean algebra homomorphism φ from the events of the automaton of state 101 to the events of the automaton of states 111 and a language homomorphism Φ from the language of the automaton of states 111 to the automaton of state 101.

0.0.1 Using Homomorphism to Verify Refinement

Language homomorphism may be used together with language containment to verify a refinement. If there is a boolean algebra homomorphism φ between the abstract automaton and the refined automaton and the refined automaton, then the correctness of the refinement can be verified if we can determine whether the language homomorphism Φ of the language of the refined automaton is contained in the language of the abstract automaton. We cannot do that directly, but we can determine whether the language of the refined automaton is contained in the language of an automaton whose Boolean algebra is produced by means of the homomorphism φ from the Boolean algebra of the abstract automaton.

This would appear to be straightforward enough, since, as previously described, one tests whether the language of a system automaton is contained in the language of a task automaton by making a model automaton out of the product of the system automaton and a third automaton whose language is the complement of the language of the task automaton and then uses the model to determine containment. The foregoing description is, however, an oversimplification. In automata-theoretic verification, the task is represented as an automaton, but the system is represented as a process, i.e., a finite state machine whose acceptance structure indicates what the finite state machine does not do. Since real systems are typically described in terms such as : "the system will never fail to deliver a message", the use of processes to represent systems is natural. Processes and automata are further related to each other as follows: for each deterministic automaton, a process may be constructed which accepts the language which is the complement of the automaton's language, and vice-versa. That relationship of course solves the difficulty: the model may be constructed by transforming the system process into an automaton and constructing the model from that automaton and the task automaton.

There remains, however, the problem that in stepwise refinement, refinements may be made of either the system process or the task automaton, and consequently, ways are needed for doing language containment with pairs of processes. If the techniques used for automaton-automaton pairs are simply applied to pairs of processes, the process whose language is the negation of the language of the abstract process is exponentially larger than the abstract process itself.

A prior-art approach to the problem applies what is termed lifting: lifting takes advantage of the fact that a process is equivalent to the product of a set of processes and that if each of the processes for which containment is being checked is treated as the product of a set of processes and each of the set of processes representing the refined process has a language homomorphism with one of the processes representing the abstract processes or with a product of several of those processes, the language containment check becomes a language containment check on pairs of processes. If the processes in the pairs being checked are small, the language containment check becomes possible even with the blow up in the size of the process described above.

The verification system described herein goes beyond lifting as follows:

First, a node-recurring transform is done of the processes in the set of abstract processes to make their acceptance structures easier to handle. In this transformation, states with incoming edges that are recur edges are split into two states, with all of the recur edges going to one of the two states. For details, see R. P. Kurshan, "Modelling Concurrent Processes", *Symposium Applied Math.* 31, pp. 45–57, 1985.

Next, the system takes advantage of the fact that the language of any deterministic process is equivalent to the intersection of the languages of a set of simple strongly deterministic automata. An automaton is strongly deterministic if it has a unique initial state and there is only one transition from a given state to another state for a given predicate of a transition from that state. An automaton is simple if there are either no cycle sets or no recur edges and, if there are cycle sets, they are pairwise disjoint. Thus, a simple decomposition of the language of the refined process can be done which makes it into an equivalent set of languages of simply strongly deterministic automata and the language containment test can now be done on automaton-process pairs as described above. Simple decomposition may similarly be done to obtain a set of languages of simple processes whose union is a language which is equivalent to the language of a deterministic automaton.

Of course, simple decomposition requires that strongly deterministic automata be made into simple automata. That is done in a preferred embodiment by taking advantage of the fact that after the node-recurring transform, recur edges and cycle sets are duals. A set of recur edges that is equivalent to a cycle set can be derived from each cycle set by making edges into recur edges when the edges connect two states such that one or both of the states do not belong to the cycle set. Thus, what is done in the simple decomposition is to produce the set of automata which correspond to the refined process such that each of the automata has only one of the cycle sets of the refined process and then make these automata into simple automata by replacing the cycle set with recur edges.

Verifying homomorphism requires verification of several different kinds of language inclusion. In general, what must be verified is that the language $L_1$ produced by a language homomorphism Φ from the language of a first finite state machine is contained in the language $L_2$ of a second finite state machine. There are several different kinds of first and second finite state machines.

First, when what is being verified is a homomorphic reduction, $L_1$ is the language of a first refined process and $L_2$ is the language of a second abstract process or the languages of a first refined automaton and a second abstract automaton respectively.

Second, when what is being verified is a task decomposition, we need a test where $L_1$ is the intersection of languages of a set of automata and $L_2$ is the language of an automaton.

Third, when what is verified is a system decomposition, we need a test where what is tested is the containment of the language of a process in the language of an automaton or vice-versa. Homomorphism of a refined process in the language of this, thus, in general, it is sufficient to provide algorithms for the following four cases:

$L_1 = L(P)$ for a process P, $$\mathcal{L}_1 = \bigcap_{i=1}^{k} \mathcal{L}(A_i)$$

for automata $A_1, \ldots, A_k$, and similaryl for $L_2$, but with deterministic transition structures. Tests for these four cases are summarized in the following table. In the table, $\phi$ is the Boolean algebra homomorphism whose support is the support of $\Phi$ and the superscritp # indicates an automaton or process which has been transformed as described above from the process or automaton to which the superscript is applied. Each Test in the table is a necessary and sufficient condition for $\Phi(L_1)L_2$ in each respectively case. cxty following a verification algorithm indicates an expression which for the complexity of the verification algorithm.

specifies a variable from the abstract file and a function involving variables from the refinement file and thereby specifies the mapping.

How the verification is done depends on whether the language containment test for the verification tests inclusion of the language of a process in the language of an automaton, the language of a process in the language of a process, or the language of an automaton in the language of an automaton.

Homomorphism Verification with a Process-Automaton Pair

This case employs the algorithm in the upper right-hand quadrant of the table of algorithms in the preceding section. The algorithm corresponds to an ordinary run of verification system 201 on the file made by concatenating the abstract file to the refinement file, except that the variables in the abstract file have the assignments specified in the horn declarations. An error is returned at run time if such an assignment is illegal. If the variable in the horn declaration to which the expression is being assigned is a state variable, then the legality of the assignment is checked at the end of "crank" (ie, as a next-state), otherwise it is checked at the time of the assignment (ie, as a current-state).

If a process of the abstract automaton process refers to a variable which is declared in the refined process but not in the abstract automaton, then a parse-time warning is given

| $L_1$ | $L_2$ | $L_2 = L(Q)$ for L'-process Q with $M_Q$ deterministic. | $L_2 = \bigcap_{i=1}^{m} L(B_i)$ for deterministic L'-automata $B_1, \ldots, B_m$ |
|---|---|---|---|
| $L_1 = L(P)$ for L-process P | | 1. Construct simple decomposition $L(Q) = \bigcap L(Q_i)$ <br> 2. Test for each i: $L(P \otimes (\varphi Q_i)^\#) = \phi$ <br> cxty: $\|P\| \|Q\|(1 + \|Z(Q)\|)$ per (??.3) | Test for each i $L(P \otimes [\varphi B_i]^\#) = \phi$ <br> cxty: $\Sigma\|P\| \|B_i\|$ |
| $L_1 = \bigcap_{i=1}^{k} L(A_i)$ for arbitrary L-automata $A_1, \ldots, A_k$ | | 1. Construct simple decomposition for each i $L(A_i) = \bigcup L(A_{ij})$ <br> 2. Construct simple decomposition $L(Q) = \bigcap L(Q_i)$ <br> 3. Test for each$(j_1, \ldots, j_k, i)$ $L(A_{j_1} \otimes \ldots \otimes A_{k_{jk}}) \otimes [\varphi Q_i]^\#) = \phi$ <br> cxty: $(\Pi\|A_i\| \|Z(A_i)\|)\|Q\|(\|Z(Q)\| + 1)$ | 1. Construct simple decomposition for each i $L(A_i) = \bigcup L(A_{ij})$ <br> 2. Test for each $(j_1, \ldots, j_k, i)$ $L(A_{1_{j1}} \otimes \ldots \otimes A_{k_{jk}}) \otimes [\varphi B_i]^\#) = \phi$ <br> cxty: $\Sigma(\Pi\|A_i\| \|Z(A_i)\|)B_j\|$ |

Implementation of Homomorphism Verification

In the preferred embodiment, a refinement of an automaton or process is specified by concatenating a file with a description 203 or 205 of an abstract automaton or process (the abstractfile) to file 203 or 205 with a description of the refined automaton or process (the refinementfile). The abstract file further contains horn declarations which specify homomorphic mappings between variables in the refinement file and variables in the abstract file. Each horn declaration and the value of that variable is taken from the file containing the refined process specification.

Homomorphism Verification with a Process-Process Pair

This case employs the algorithm set forth in the upper left hand quadrant of the table of algorithms. It is thus necessary to first construct the simple decomposition of the abstract process by doing the node-recurring transform described above, then constructing processes with single cycle sets, and finally converting the cycle sets to sets of recur edges as described above.

If there are no recur or cyset declarations in the abstract file, run in the usual fashion, except that there is no need to look for cycles.

Else, for the first run, if there are recur declarations, set a plus bit at the end of each global state, as follows: With the packing of the initial states, plus gets set to 0. In the global state transition (STATE, plus)→(NEXT_STATE,plus')

if STATE→NEXT_STATE crosses a recur edge in the abstract file, (a global state transition of the form v1, v2, ..., vk→w1, w2, ...,wk where for some j, there is a recur edge vj→wj [or recur *→wj or recur vj→*] in the abstract file, set plus=1, else set plus=0.

Also, disregard all the cyset declarations in the abstract file and use the recur edges in the abstract file only to define the updating of plus. Create a cyset mask (a mask which permits the rapid location of cycle sets in the reached state table) for plus=0.

If originally, there were no cysets in the abstract file, the first run is sufficient. Otherwise, if there are no recurs but there are cysets, the cysets are split so that no two cysets overlap. This is done by putting a first mark between the cysets of different processes and then using a second mark to split the cysets so that no 2 cysets overlap-cyset {1,2}, {3}, {1,4}, {3,5} for a process becomes {1,2}, {3}×{1,4}, {3,5} Then N=number of strings of cysets between X's (N=2 here). (If there are no recur edges in the abstract file but there are cysets, we don't do the first iteration, and start our work with the second.) Packing the plus bit applies only to the first iteration.

Runs for i=1. . . N are each as follows: disregard all recur edges in the abstract file; ignore the cyset declarations in that file with regard to their usual interpretation. Treat each global state transition V→W as you would a recur edge UNLESS both V, W are in the same set of i=th cyset string X . . 1 . . X . . 2 . . X . . 3 . . X . . . [Note: if V=v1, v2, . . . ,vk and W=w1, w2, . . . , wk and vj, wj are in the same set of the i-th cyset string Xvj,wj, . . . ,X then we say "V and W are in the same set of the i-th cyset"] (Cysets/recur edges of the refinement file are treated normally, and are separate from this description.)

Error report: we print out before we start:
Hom check: 1[or 0] recur checks; N cyset checks.
As we proceed through the i=0. . . N loop, print out:

Recur check passed.

Cyset check 1 passed.

Cyset check 2 passed.

. . .

Cyset check N passed.

If the recur edge check (i=0) fails, just print:
Recur check failed:
and report the errors. If the i-th cyset check fails, print out:
Cyset check i failed:
proc .X.Y.Z:
cyset {states}, {states},. . .
and again report the errors. The foregoing can be optimized by limiting the testing of predicates in the refinement to those with values which are valid at the associated states of the abstract process. These checks need only be done for the first iteration. In each run (for i>0), the graph (and hence the representation of reached states) will be the same. The representation of reached states may be, for example, a reached state table (RST) or a binary decision diagram (BDD). The only differences will be the order of the search, and which edges are recur edges. We thus reuse the representation of the reached states for each subsequent run by clearing those fields of the representation having to do with cycle detection which are set during the search or are dependent upon the order of the search. If there is no hom declaration in the abstract file, there will be a compilation error.

Homomorphism Verification with an Automaton-Automaton Pair

This is an implementation of the algorithm of the lower right-hand quadrant of the algorithm table. As indicated there, we make several iterations, indexed over i=1. . . N.

If there are no recur or cyset declarations in the refinement file, return and stop: the refinement file defines empty an empty language and the homomorphisms are verified.

Else if there are recur declarations in the refinement file, set the plus bit at the end of each global state, as follows: With the packing or the initial states, plus gets packed with value 0. In the global state transition.

(STATE,plus)→(NEXT_STATE,plus)

If STATE→NEXT_STATE crosses an active (see below) recur edge of the refinement file, set plus=1, else set plus 0. Then create in effect, a cyset for plus=0 by creating a cyset mask for plus=0 Pre-process the cyset declarations in the refinement file as described for the process-process case.

When this is done, make runs for i=1. . . N where i cycles over a succession of definitions of which recur edges and cysets are active. Treat each global state transition V→W as recur edge UNLESS both V, W are in the same set of some "active" cyset declaration. (Cyset/recur edges of the abstract file are treated normally, and are separate from this description.)

Definition of active recur/cyset declaration: let $T_1, T_2, \ldots, T_n$ be those processes or tasks defined at the root of the refinement file (ie, top level processes) which have at least 1 cyset or recur declaration (including all sub-processes, sub-sub-processes, etc.). For each $T_j$, let $R_j$ be all the recur edge declarations of $T_j$, and let $Z_{j1}, Z_{j2}, \ldots$ be the list of cyset declarations in $T_j$ (after splitting the cysets). An active assignment consists of a selection, for each j=1. . . n, of one of $R_j$, $Z_{j1}$, $Z_{j2}$. . . and so forth in the list (*) to be active. For the definition of run i=1. . . N, i cycles over all such active assignments. If mj is the number of elements in the (*), then N=m1*m2* . . . *mn.

Error report: we print out before we start:
Hom check: n automata in domain
As we proceed through the i=1. . . N loop, print out:
Check i out of N passed.
If the i-th check fails, print:
Check i failed.
for each j=1. . . n print out:
Automaton Tj:
followed by the active Rj/Zjk for that run and report the errors.

CONCLUSION

The foregoing Detailed Description has disclosed to those skilled in the art of formal verification how to make and use formal verification systems which employ the novel techniques for reducing the computational complexity of model automata disclosed herein. The Detailed Description has further disclosed the best mode presently known to the inventors of implementing their techniques. It will be immediately apparent to those skilled in the art of formal verification that many other implementations of the techniques can be made which employ the principles disclosed herein and that the techniques can be used not only in formal verification, but in any context where there is a need to reduce the computational complexity of language containment testing. For example, the localization techniques described herein could be used in any system which wanted to employ language containment to determine whether a design performs a task.

All of the above being the case, the foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the law.

What is claimed is:

1. Improved design testing apparatus for making a determination whether a design performs a task, the design testing apparatus being of the type which includes means for making the determination by testing a model automaton including variables and the improvement comprising:
    a processor operable to create a directed graph of dependency relations of the variables; and
    means for using the directed graph to make a reduced version of the model automaton,
        wherein said means for using the directed graph comprises means for reducing the size of the directed graph to form a reduced version of the directed graph,
        wherein said means for reducing comprises means for resizing variables having a value upon which the performance of the reduced version of the model automaton does not depend,
    the design testing apparatus making the determination by testing the reduced version of the model automaton.

2. Improved design testing apparatus for making a determination whether a design performs a task, the design testing apparatus being of the type which includes means for making the determination by testing a model automaton including variables and the improvement comprising:
    a processor operable to create a directed graph of dependency relations of the variables;
    means for using the directed graph to make a reduced version of the model automaton, wherein said means for using the directed graph comprises means for reducing the size of the directed graph to form a reduced version of the directed graph; and
    means for freeing a set of variables each said freed variable thereby being treated as a primary input for said reduced model automaton.

3. The improved design testing apparatus of claim 2 further comprising:
    means for revising said set of freed variables if said task is performable by said reduced version of the model automaton.

4. A method for testing a design to determine whether the design defines a task, the method comprising:
    constructing a model automaton, the model automaton being of the type that includes variables;
    creating a directed graph of dependency relations of the variables;
    using the directed graph to make a reduced version of the model automaton,
        wherein said step of using comprises the step of reducing the size of the directed graph to form a reduced version of the directed graph,
        wherein said step of reducing comprises the step of resizing variables having a value upon which the reduced version of the model automaton does not depend; and
    determining whether the design defines the task using the reduced version of the model automaton.

5. A method for testing a design to determine whether the design defines a task, the method comprising:
    constructing a model automaton, the model automaton being of the type that includes variables;
    creating a directed graph of dependency relations of the variables;
    using the directed graph to make a reduced version of the model automaton, wherein said step of using comprises the step of reducing the size of the directed graph to form a reduced version of the directed graph;
    freeing a set of variables, each said freed variable thereby being treated as a primary input for said reduced model automaton; and
    determining whether the design defines the task using the reduced version of the model automaton.

6. The method of claim 5 further comprising the step of:
    revising said set of freed variables of said task performable by said reduced version of the model automaton.

7. A method used in design verification apparatus for verifying that a first process is a valid refinement of a second process, the design verifications apparatus being of the type which tests whether a process's language is contained in an automaton's language, there being a language homomorphism between the language of the first process and the language of the second process and the method comprising the steps performed in the design verification apparatus of:
    making a set of simple strongly deterministic automata which have languages such that the intersections of the languages is equivalent to the language of the second process; and
    testing whether the language of the first process is contained in the language of each of the simple strongly deterministic automata, wherein the testing step determines whether the first process is a valid refinement of the second process.

8. A design testing apparatus for determining whether a design performs a task, the design testing apparatus including means for testing a model automaton having variables, the apparatus comprising:
    a processor operable to create a directed graph of dependency relations of the variables; and
    a reducer for using the directed graph to make a reduced version of the model automaton, the reduced version of the model automaton being localized with respect to the task, wherein the apparatus determines whether the reduced version of the model automaton performs the task.

9. Improved design testing apparatus for making a determination whether a design performs a task, the design testing apparatus being of the type which includes means for making the determination by testing a model including variables and the improvement comprising:
    a processor operable to create a directed graph of dependency relations of the variables;
    means for using the directed graph to make a reduced version of the model, wherein said means for using the directed graph includes means for reducing the size of the directed graph to form a reduced version of the directed graph, wherein said means for reducing includes means for resizing variables having a value upon which the performance of the reduced version of the model does not depend, wherein the apparatus determines whether the reduced version of the model performs the task.

10. Improved design testing apparatus for making a determination whether a design performs a task, the design testing apparatus being of the type which includes means for making the determination by testing a model including variables and the improvement comprising:

a processor operable to create a directed graph of dependency relations of the variables;

means for using the directed graph to make a reduced version of the model, wherein said means for using the directed graph includes means for reducing the size of the directed graph to form a reduced version of the directed graph, wherein said means for reducing comprises means for freeing a set of variables each said freed variable thereby being treated as a primary input for said reduced model, wherein the apparatus determines whether the reduced version of the model performs the task.

11. The improved design testing apparatus of claim 10 further comprising means for revising said set of freed variables if said task is performable by said reduced version of the model.

12. A method for testing a model of a design to determine whether the design defines a task, the model being of the type that includes variables, the method comprising:

creating a directed graph of dependency relations of the variables;

using the directed graph to make a reduced version of the model, wherein said means for using the directed graph includes means for reducing the size of the directed graph to form a reduced version of the directed graph, wherein said means for reducing includes means for resizing variables having a value upon which the performance of the reduced version of the model does not depend; and determining whether the reduced version of the model performs the task.

13. A method for testing a model of a design to determine whether the design defines a task, the model being of the type that includes variables, the method comprising:

creating a directed graph of dependency relations of the variables;

using the directed graph to make a reduced version of the model, wherein said means for using the directed graph includes means for reducing the size of the directed graph to form a reduced version of the directed graph;

freeing a set of variables, each said freed variable thereby being treated as a primary input for said reduced model; and determining whether the reduced version of the model performs the task.

14. The method of claim 13 further comprising the step of:

revising said set of freed bariables of said task performable by said reduced version of the model.

* * * * *